United States Patent
Yogeeswaran

(10) Patent No.: US 11,029,354 B1
(45) Date of Patent: *Jun. 8, 2021

(54) SYSTEMS AND METHODS FOR DISTRIBUTED SENSING OF A POWERLINE CONDUCTOR

(71) Applicant: Facebook, Inc., Menlo Park, CA (US)

(72) Inventor: Karthik Yogeeswaran, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/745,025

(22) Filed: Jan. 16, 2020

Related U.S. Application Data

(63) Continuation of application No. 15/938,332, filed on Mar. 28, 2018, now Pat. No. 10,571,509.
(Continued)

(51) Int. Cl.
*G01R 31/11* (2006.01)
*H04B 10/071* (2013.01)
(Continued)

(52) U.S. Cl.
CPC ............ *G01R 31/11* (2013.01); *G01R 31/085* (2013.01); *H04B 10/071* (2013.01);
(Continued)

(58) Field of Classification Search
CPC .. G01R 31/11; G01R 31/085; H04Q 2209/30; H04Q 9/00; H04Q 9/04; H04B 10/071;
(Continued)

(56) References Cited

U.S. PATENT DOCUMENTS

| 2,685,068 A | 7/1954 | Goubau |
| 4,709,339 A | 11/1987 | Fernandes |

(Continued)

FOREIGN PATENT DOCUMENTS

| CN | 104111404 A | 10/2014 |
| CN | 204408639 U | 6/2015 |

(Continued)

OTHER PUBLICATIONS

"AccessWrap", AFL Telecommunications Europe Ltd., May 9, 2012, 1 page.
(Continued)

*Primary Examiner* — Melissa J Koval
*Assistant Examiner* — Trung Q Nguyen
(74) *Attorney, Agent, or Firm* — FisherBroyles, LLP

(57) ABSTRACT

A system includes (1) a signal transmitter that includes (a) a radio frequency generator that generates a first radio frequency electromagnetic signal and (b) a first transducer that converts the first radio frequency electromagnetic signal to a surface wave mode signal imposed onto a powerline conductor at a first location in a first direction toward a second location along the powerline conductor, (2) a signal receiver that includes a second transducer located at the second location that converts the surface wave mode signal into a second radio frequency electromagnetic signal, and (3) an analysis subsystem that monitors a signal strength of the second radio frequency electromagnetic signal over time to determine whether a physical encroachment of the powerline conductor exists between the first location and the second location.

20 Claims, 10 Drawing Sheets

Related U.S. Application Data

(60) Provisional application No. 62/573,470, filed on Oct. 17, 2017.

(51) Int. Cl.
  *H04B 10/2575* (2013.01)
  *G01R 31/08* (2020.01)
  *H04Q 9/00* (2006.01)

(52) U.S. Cl.
  CPC .......... *H04B 10/2575* (2013.01); *H04Q 9/00* (2013.01); *H04Q 2209/30* (2013.01)

(58) Field of Classification Search
  CPC ..... H04B 10/2575; G08C 19/12; Y02E 60/00; G01D 4/002
  USPC .......... 324/500, 501, 508, 510, 764.01, 300, 324/314, 329, 600, 637, 639, 76.11, 324/76.35, 76.36, 76.54
  See application file for complete search history.

(56) References Cited

U.S. PATENT DOCUMENTS

| | | | |
|---|---|---|---|
| 4,799,005 | A | 1/1989 | Fernandes |
| 4,801,937 | A | 1/1989 | Fernandes |
| 4,805,979 | A | 2/1989 | Bossard et al. |
| 5,003,278 | A | 3/1991 | May |
| 5,426,360 | A | 6/1995 | Maraio et al. |
| 5,727,373 | A | 3/1998 | Appleford et al. |
| 6,813,422 | B1 | 11/2004 | Krishnamurthy et al. |
| 8,411,259 | B2 | 4/2013 | Levin et al. |
| 8,786,292 | B2 | 7/2014 | Parsons |
| 8,831,394 | B2 | 9/2014 | Kimbrell et al. |
| 9,051,153 | B2 | 6/2015 | Lichoulas et al. |
| 9,255,821 | B1 | 2/2016 | Miyamoto et al. |
| 10,390,111 | B2 | 8/2019 | Yogeeswaran |
| 2004/0266332 | A1 | 12/2004 | Lang |
| 2005/0164666 | A1 | 7/2005 | Lang et al. |
| 2008/0077336 | A1 | 3/2008 | Fernandes |
| 2008/0122642 | A1* | 5/2008 | Radtke ............. G01R 19/16547 340/660 |
| 2012/0027062 | A1 | 2/2012 | Garcia |
| 2014/0361785 | A1 | 12/2014 | Radan |
| 2016/0054363 | A1 | 2/2016 | Rostron et al. |
| 2016/0246666 | A1* | 8/2016 | Gubba Ravikumar ..................... G05F 1/625 |
| 2017/0176703 | A1 | 6/2017 | Baker et al. |
| 2018/0143234 | A1 | 5/2018 | Saxby |
| 2019/0113561 | A1 | 4/2019 | Yogeeswaran |
| 2019/0310304 | A1 | 10/2019 | Yogeeswaran |

FOREIGN PATENT DOCUMENTS

| | | |
|---|---|---|
| CN | 204964679 U | 1/2016 |
| CN | 106226603 A | 12/2016 |
| CN | 111448466 A | 7/2020 |
| JP | 2002-345175 A | 11/2002 |
| WO | 99/58992 A2 | 11/1999 |
| WO | 2004/032277 A1 | 4/2004 |
| WO | 2019/079344 A1 | 4/2019 |
| WO | 2019/079349 A1 | 4/2019 |

OTHER PUBLICATIONS

Musson et al., "Application of Goubau Surface Wave Transmission Line for Improved Bench Testing of Diagnostic Beamline Elements", Proceedings of PAC09, May 1, 2009, pp. 4060-4062.

"Fiber Optic Cable", AFL Telecommunications Europe Ltd, Jun. 25, 2014, pp. 59-60.

Lilien, J-L, "Power Line Aeolian Vibrations", Department of Electronics, Electricity, and Computer Sciences, Transmission and Distribution of Electrical Energy, Nov. 1, 2013, pp. 1-26.

"SkyWrap Information", AFL Telecommunications Europe Ltd, Jul. 23, 2013, pp. 1-2.

Stulle et al., "The Goubau Line—Surface Waves for Bench Testing of Beam Instrumentation at High Frequencies", Proceedings of BIW 2012, Nov. 1, 2012, pp. 146-148.

"Understanding OTDRs", Anritsu Company, Nov. 1, 2011, 60 pages.

"MW90010A Coherent OTDR", Anritsu Company, Jan. 26, 2015, 8 pages.

Yogeeswaran, Karthik, "Systems and Methods for Distributed Sensing of a Powerline Conductor", U.S. Appl. No. 15/938,332, filed Mar. 28, 2018, 65 pages.

International Search Report and Written Opinion received for PCT Application Serial. No. PCT/US2018/056149 dated Feb. 19, 2019, 12 pages.

International Search Report and Written Opinion received for PCT Application Serial No. PCT/US2018/056143 dated Jan. 28, 2019, 11 pages.

Yogeeswaran, Karthik, "Systems and Methods for Monitoring a Powerline Conductor Using an Associated Fiber Optic Cable", U.S. Appl. No. 15/938,348, filed Mar. 28, 2018, 50 pages.

Yogeeswaran, Karthik, "Systems and Methods for Monitoring a Powerline Conductor Using an Associated Fiber Optic Cable", U.S. Appl. No. 16/450,880, filed Jun. 24, 2019, 52 pages.

Non-Final Office Action received for U.S. Appl. No. 15/938,348 dated Sep. 27, 2018, 17 pages.

Notice of Allowance received for U.S. Appl. No. 15/938,348 dated Apr. 2, 2019, 20 pages.

Non-Final Office Action received for U.S. Appl. No. 15/938,332 dated Aug. 1, 2019, 34 pages.

Notice of Allowance received for U.S. Appl. No. 15/938,332 dated Oct. 17, 2019, 21 pages.

Non-Final Office Action received for U.S. Appl. No. 16/450,880 dated Dec. 16, 2020, 25 pages.

Extended European Search Report received for EP Patent Application Serial No. 18868228.0 dated Nov. 6, 2020, 9 pages.

International Search Report and Written Opinion received for PCT Application Serial. No. PCT/US2018/056143 dated Apr. 30, 2020, 8 pages.

International Search Report and Written Opinion received for PCT Application Serial. No. PCT/US2018/056149 dated Apr. 30, 2020, 9 pages.

* cited by examiner

Method 1000

SYSTEMS AND METHODS FOR DISTRIBUTED SENSING OF A POWERLINE CONDUCTOR

CROSS REFERENCE TO RELATED APPLICATION

This application is a continuation of U.S. patent application Ser. No. 15/938,332, filed Mar. 28, 2018, which claims the benefit of U.S. Provisional Application No. 62/573,470, filed Oct. 17, 2017, the disclosures of each of which are incorporated herein, in their entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
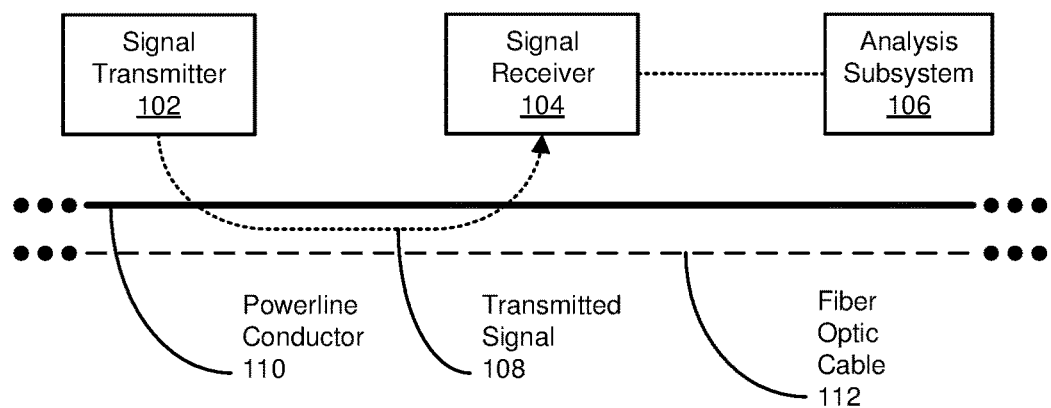
FIG. 1 is a block diagram of an exemplary system for distributed sensing of a powerline conductor.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

Some typical electrical transmission and distribution systems may include some level of monitoring equipment to detect severed powerlines and other anomalies. Typically, such equipment may include head-end line monitoring gear in either or both the transmission space (e.g., where powerline conductors traditionally carry thousands of volts over long distances) or at the substation level (e.g., where higher voltages are often converted to lower voltages prior to distribution to consumers). In addition, in some circumstances, "smart" meters installed at the customer premises may collect data regarding voltage levels, power consumption, and so on.

Consequently, data regarding the current operational status of large portions of the transmission and distribution systems tends to be coarse-grained due at least in part to the location of the monitoring gear. For example, in an electrical transmission system, current supervisory control and data acquisition (SCADA) systems may detect when a particular powerline conductor has failed, but the particular location of the failure may be difficult to ascertain due to the expanse over which the conductor may extend. Similarly, due to the potentially large number of branching circuits sometimes involved in a distribution system, determining a particular location or cause of a failure in such a system may also prove to be problematic, possibly requiring a significant amount of time and expense to identify accurately.

The present disclosure is generally directed to systems and methods for distributed sensing of a powerline conductor. As will be explained in greater detail below, embodiments of the instant disclosure may facilitate the use of signals transmitted and received along and external to the powerline conductor (e.g., a surface wave mode signal travelling along and external to the powerline conductor, a light signal the generates backscattered light in an optical fiber mechanically coupled to the powerline conductor, and/or the like) to monitor at least one characteristic of the signal and to determine a status of the powerline conductor based at least in part on the at least one characteristic, thus potentially providing more detailed and more finely-grained information regarding the status or condition of the conductor.

Figure 2:
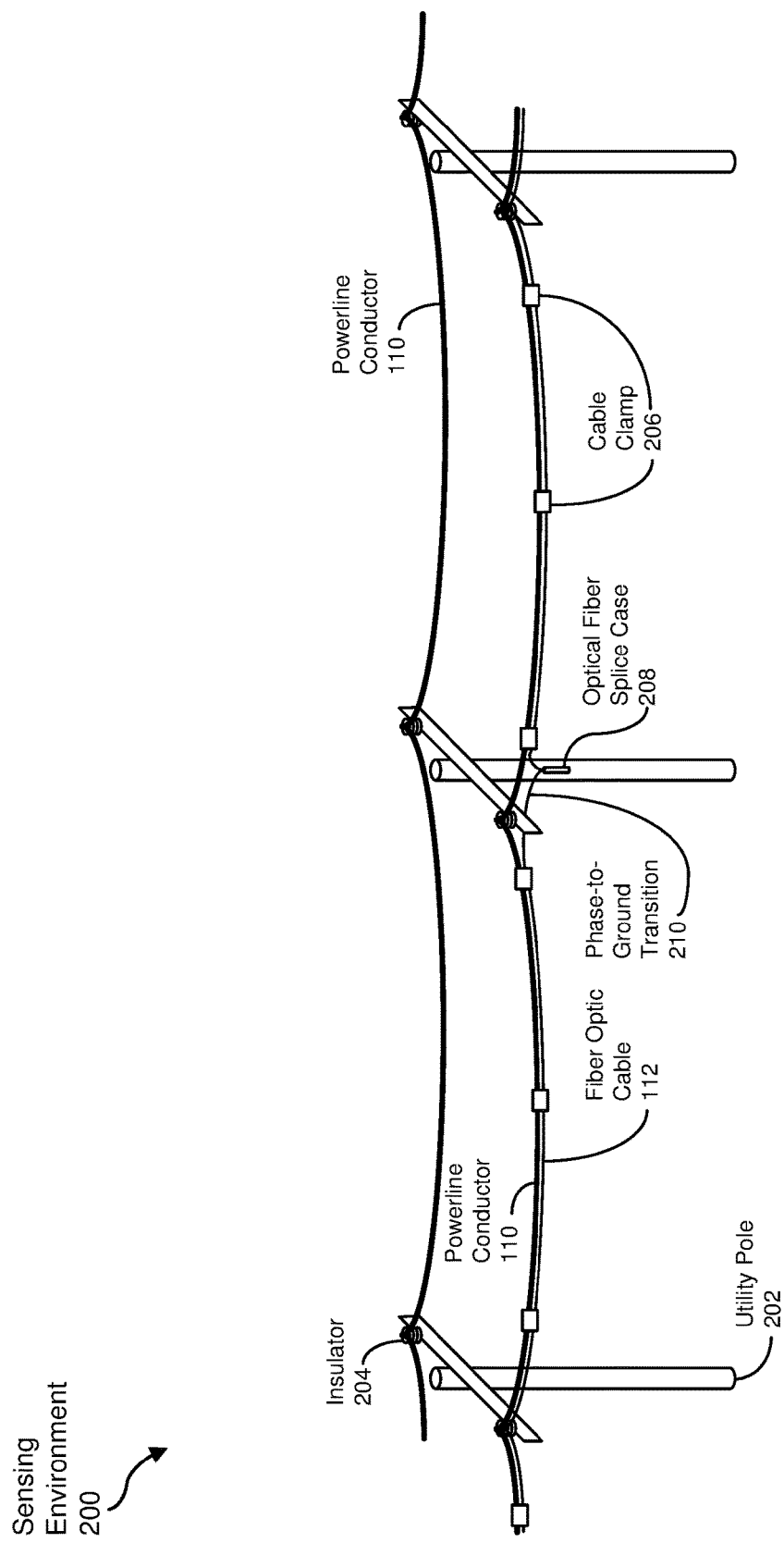
FIG. 2 is a graphical representation of an exemplary sensing environment in which the exemplary system of FIG. 1 may be utilized.
Figure 3:
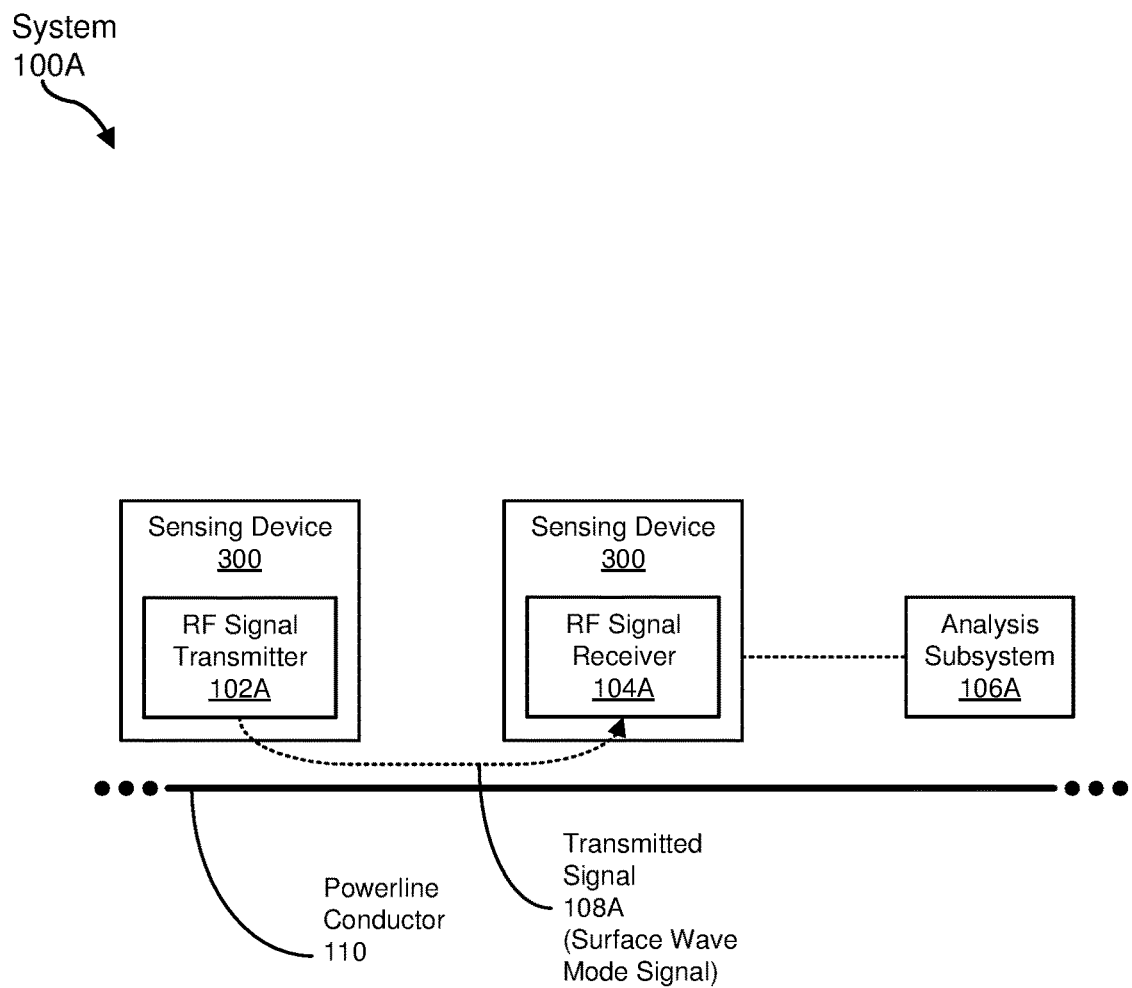
FIG. 3 is a block diagram of an exemplary embodiment of the system of FIG. 1 employing a surface wave mode signal along the powerline conductor.

The following will provide, with reference to FIGS. 1-10, detailed descriptions of systems and methods for distributed sensing of a powerline conductor. Such an exemplary system that may include a signal transmitter and a signal receiver, along with an analysis subsystem, is discussed in conjunction with FIG. 1. An exemplary sensing environment that may employ the exemplary system of FIG. 1 is discussed in connection with FIG. 2. With reference to FIG. 3, an example of the system of FIG. 1 that employs a surface wave mode signal is discussed. Exemplary sensing devices employable in the system of FIG. 3 are presented in reference to FIGS. 4 and 5. With respect to FIG. 6, an example of the system of FIG. 1 that employs a backscattered light signal in an optical fiber mechanically coupled along the powerline conductor is described, and an example sensing device employable in such a system is presented in conjunction with FIG. 7. In reference to FIG. 8, a description is provided of an exemplary communication timing system employable in any of the sensing devices of FIG. 4, 5, or 7. In conjunction with FIG. 9, an exemplary method for distributed sensing of a powerline conductor is discussed, and an exemplary method of installing a system for distributed sensing of a powerline conductor is presented in reference to FIG. 10.

FIG. 1 is a block diagram of an exemplary system 100 for distributed sensing of a powerline conductor 110. In some examples, powerline conductor 110 may be an electrical conductor (e.g., a conductive cable) used in an electrical power transmission system (e.g., approximately 110 kilovolt (kV) or greater transmission lines), sub-transmission system (e.g., approximately 35 kV to 110 kV sub-transmission lines), distribution system (e.g., approximately 35 kV or less distribution lines), or any other electrical conductor for providing electrical power. In some examples, system 100 may include a fiber optic cable 112 associated with (e.g., mechanically coupled to) powerline conductor 110. In some embodiments, fiber optic cable 112 may include one or more optical fibers for carrying communication data. For example, fiber optic cable 112 may be helically wrapped about powerline conductor 110 (e.g., as part of an aerial outside plant (aerial OSP) fiber optic cable installation). However, other ways of associating fiber optic cable 112 with powerline conductor 110 are also possible.

As depicted in FIG. 1, system 100 may include a signal transmitter 102 that transmits a signal for propagation along and external to powerline conductor 110, and a corresponding signal receiver 104 that receives at least a portion of the transmitted signal. In some examples, signal transmitter 102 and signal receiver 104 may be either co-located at a particular position along powerline conductor 110 or distributed at two separate locations (e.g., separated by tens, hundreds, or thousands of meters) along powerline conductor 110.

Also included in system 100, in at least some embodiments, may be an analysis subsystem 106 that may monitor at least one characteristic of the received portion of the transmitted signal, and may determine a status of powerline conductor based at least in part on the at least one characteristic. In some examples, analysis subsystem 106 may be positioned remotely from signal receiver 104, or may be at least partially co-located with signal receiver 104. In the case of analysis subsystem 106 being positioned remotely from signal receiver 104, analysis subsystem 106 may receive information (e.g., wirelessly, by way of fiber optic cable 112, powerline conductor 110, or another communication path) from signal receiver 104. In some embodiments, analysis subsystem 106 may be a computer subsystem that operates as part of a SCADA system that analyzes data to determine a current physical and/or operational state of powerline conductor 110.

FIG. 2 is a graphical representation of an exemplary sensing environment 200 in which system 100 of FIG. 1 may be utilized. As depicted in the example of FIG. 2, sensing environment 200 may include an electrical power transmission or distribution system having a plurality of utility poles 202 carrying multiple powerline conductors 110. While any number of powerline conductors 110 may be carried via utility poles 202, two powerline conductors 110 are illustrated in FIG. 2 for visual simplicity. In some examples, powerline conductors 110 are mechanically coupled to utility poles 202 via insulators 204, although other types of components (e.g., taps, standoffs, etc.) may be employed in various embodiments.

Also shown in FIG. 2 is fiber optic cable 112 aligned with, and mechanically coupled to, powerline conductor 110. As mentioned above, fiber optic cable 112 may be helically wrapped about powerline conductor 110, such as by way of a human-powered or electrically-powered robotic device. However, other physical relationships between powerline conductor 110 and fiber optic cable 112 are also possible. While only one fiber optic cable 112 is depicted in FIG. 2, multiple powerline conductors 110 employing the same utility poles 202 may each have a corresponding fiber optic cable 112 attached or otherwise coupled thereto. As depicted in FIG. 2, fiber optic cable 112 may be secured to powerline conductor 110 via one or more cable clamps 206. In some examples described in greater detail below, each of one or more cable clamps 206 may include a corresponding signal transmitter 102 and/or signal receiver 104. In some examples, fiber optic cable 112 may follow a powerline conductor 110 associated with a particular phase of the power being transmitted, or may alternate between two or three different phases, such as at phase-to-ground transitions 210 at utility poles 202, to provide some level of sensing of all three phases with a single fiber optic cable 112. Also, in some examples described below, fiber optic cable 112 may not be necessary for employing signal transmitter 102 and/or signal receiver 104.

In some embodiments, in addition to installing signal transmitter 102 and/or signal receiver 104 along powerline conductors 110 strung along utility poles 202, as shown in FIG. 2, one or more additional signal transmitters 102 and/or signal receivers 104 may be installed at the secondary side of transformers (not depicted in FIG. 2) that supply power to customer premises.

Additionally, FIG. 2 illustrates an optical fiber splice case 208 that, in some embodiments, splices corresponding ends of optical fibers of fiber optic cable 112 together. For example, relatively long stretches (e.g., 1 km-long expanses) of fiber optic cable 112 that may be coupled to powerline conductor 110 may be mechanically coupled together, thermally fused together, or otherwise coupled in optical fiber splice case 208, which may include optical couplers, amplifiers, and/or other components to facilitate transmission of optical data signals from one expanse of fiber optic cable 112 to the next. In some examples, such as that shown in FIG. 2, optical fiber splice case 208 may be attached to, or positioned on, a utility pole 202. In some examples, such as that depicted in FIG. 2, optical fiber splice case 208 may be mounted on a lower portion of utility pole 202 (e.g., in a lower-voltage section at a safe distance away from higher-voltage powerline conductor 110 to facilitate installation of optical fiber splice case 208). Additionally, in some embodiments, a phase-to-ground transition 210 may be coupled with each fiber optic cable 112 to be interconnected to provide electrical isolation from powerline conductor 110. However, other locations for optical fiber splice case 208 may also be possible.

FIG. 3 is a block diagram of an exemplary embodiment (system 100A) of system 100 of FIG. 1 employing a surface wave mode signal operating as a transmitted signal 108A along powerline conductor 110. Generally, as used herein, a "surface wave mode signal" is an electromagnetic signal that may be propagated along, and at least partially external to, a conductor (e.g., powerline conductor 110), where the signal is concentrated in a volume adjacent to the conductor. In at least some examples, a sensing device 300 includes a radio frequency (RF) signal transmitter 102A (e.g., operating as signal transmitter 102 of FIG. 1) that is located at a first location along powerline conductor 110. In some embodiments, RF signal transmitter 102A transmits a surface wave mode signal (e.g., as transmitted signal 108A, possibly in the range of 800 megahertz (MHz) to 8 gigahertz (GHz)) along powerline conductor 110 in a direction toward a second sensing device 300 located at a second location along powerline conductor 110, and that may include an RF signal receiver 104A (e.g., operating as signal receiver 104 of FIG. 1). RF signal receiver 104A may then receive at least a portion of transmitted signal 108A. Based on the received portion of transmitted signal 108A, in some examples, analysis subsystem 106A may monitor a signal strength of transmitted signal 108A over time to determine whether a physical encroachment of powerline conductor 110 exists between the first and second locations (e.g., between first and second sensing devices 300). In some embodiments, a reduced signal strength exhibited over some time period may indicate at least some blocking of the surface wave field (e.g., transmitted signal 108A) propagating adjacent to powerline conductor 110, thus possibly indicating physical contact of some item (e.g., a tree branch, an animal, or the like) with powerline conductor 110 that may cause one or more anomalies (e.g., undue physical stress on powerline conductor 110, combustion of the item or powerline conductor 110, or the like). Additionally, in some examples, some measurable effect on the signal strength of the surface wave field may be sensed in response to an obstruction that does not make physical contact with powerline conductor 110 (e.g., tree branches or tree leaves located some short distance from powerline conductor 110), thus possibly facilitating detection, in advance, of an impending hazardous condition impacting powerline conductor 110. Moreover, while analysis subsystem 106A is depicted in FIG. 3 as located remotely from sensing device 300 that includes RF signal receiver 104A, analysis subsystem 106A may be at least partially co-located with RF signal receiver 104A in some examples.

Figure 4:
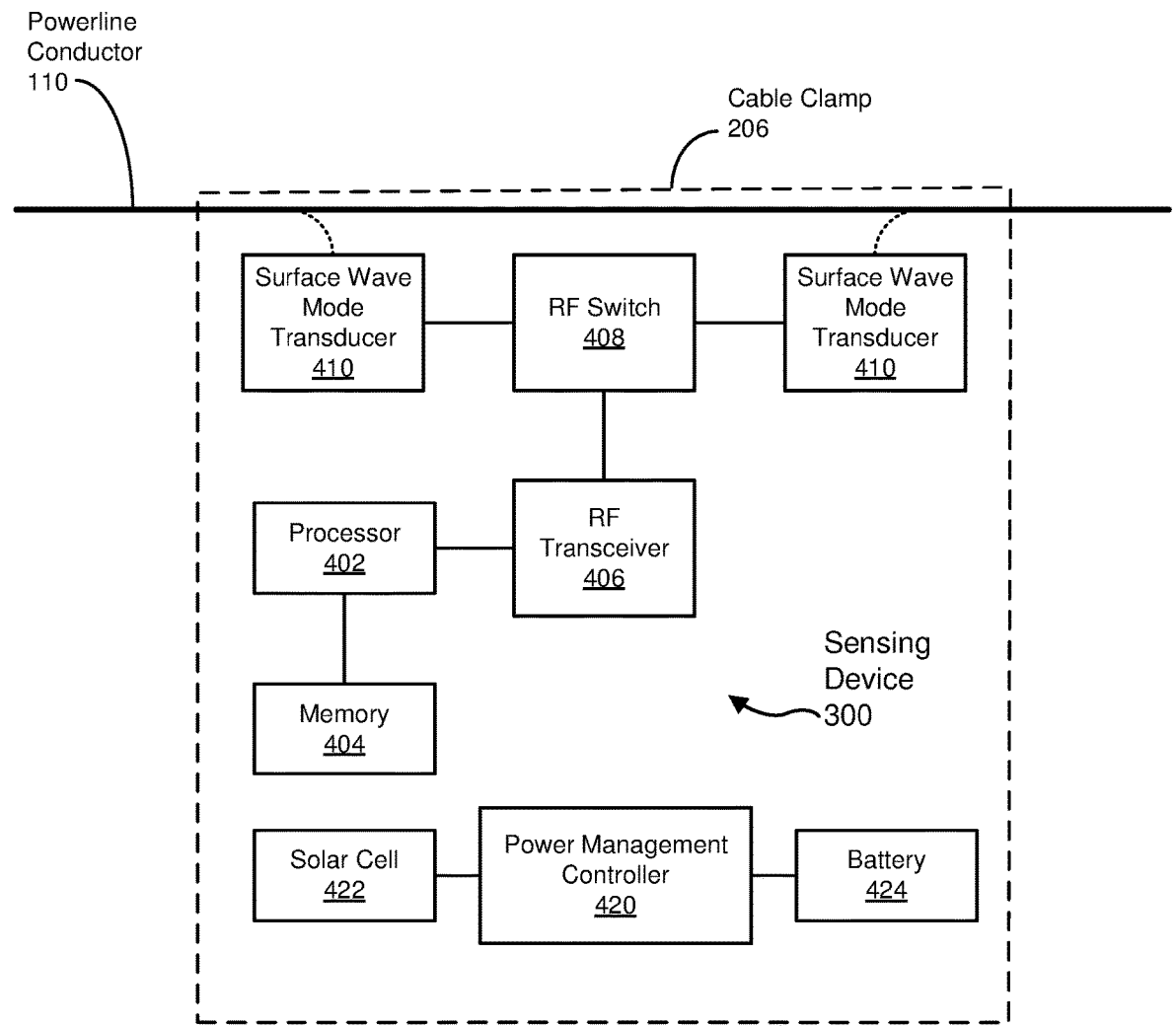
FIG. 4 is a block diagram of an exemplary sensing device employable in the system of FIG. 3.

FIG. 4 is a block diagram of an exemplary sensing device 300 employable in system 100A of FIG. 3. As illustrated in FIG. 4, sensing device 300 may include, in some embodiments, a processor 402, a memory 404, an RF transceiver 406, an RF switch 408, and a pair of surface wave mode transducers 410. In addition, in some examples, sensing device 300 may include a power management controller 420 coupled with a solar cell 422 and/or a battery 424.

RF transceiver 406, in some examples, may generate RF signals to be delivered to RF switch 408 based on input (e.g., data, signals, or commands) provided by processor 402. Also, in some embodiments, RF transceiver 406 may receive RF signals from RF switch 408 and, based on the received RF signals, generate output (e.g., data, signals, or status) for processor 402. In some examples, the generated and/or received RF signals may be test signals transmitted or received as surface wave mode signals via powerline conductor 110 primarily for the purpose of detecting physical encroachment upon powerline conductor 110. In other embodiments, the generated and/or received RF signals may also serve as wireless communication signals, such as for a wireless local area network (e.g., Wi-Fi), which may have one or more carrier and/or subcarrier frequency. In such cases, physical encroachment of powerline conductor 110 may be reflected in a reduced received signal strength indicator (RSSI) associated with the RF signal.

RF switch 408, in some embodiments, may direct the RF signal generated by RF transceiver 406 to one or both surface wave mode transducers 410 for transmission in one or both directions along powerline conductor 110. Additionally or alternatively, in some examples, RF switch 408 may receive an RF signal from either surface wave mode transducer 410 and direct that RF signal to RF transceiver 406.

In some examples, each surface wave mode transducer 410 may receive, from RF switch 408, an RF signal and transform the RF signal into a surface wave mode signal for transmission in a corresponding direction along powerline conductor 110. Additionally or alternatively, each surface wave mode transducer 410 may receive a surface wave mode signal from a corresponding direction along powerline conductor 110, transform the received surface wave mode signal into an RF signal to be used by RF transceiver 406, and forward the RF signal to RF switch 408. Specific examples of RF transceiver 406, RF switch 408, and surface wave mode transducers 410 are described in greater detail below in conjunction with FIG. 5.

Processor 402, in some embodiments, may generate and receive test and/or data signals (e.g., baseband signals) for RF transceiver 406 and/or may receive such signals from transceiver 406. In addition, in some examples, processor 402 may process the signals received from RF transceiver 406 to provide sufficient information to analysis subsystem 106 (e.g., by way of a wireless interface not depicted in FIG. 4) to determine whether powerline conductor 110 is experiencing a physical encroachment. In other embodiments, processor 402 may at least partially operate as analysis subsystem 106 to make that determination.

In some examples, processor 402 may employ RF transceiver 406, RF switch 408, and surface wave mode transducers 410 as a wireless communication interface to communicate with one or more other sensing devices 300. An example of using surface wave mode signals as communication signals is described in greater detail below in connection with FIG. 5.

Processor 402, in some examples, may be a microprocessor, microcontroller, digital signal processor (DSP), application-specific integrated circuit (ASIC), or other hardware processor that may receive the indications from the detection components. In one example, processor 402 may be a mixed-signal processor.

Memory 404, in some examples, may provide storage for data, signals, or status received and/or generated by processor 402. In some embodiments, memory 404 may also include instructions to be executed by processor 402 to perform its various functions or tasks, as described in greater detail herein. In one embodiment, memory 404 may be a separate memory component, or may be incorporated within processor 402. Memory 404 generally represents any type or form of volatile or non-volatile storage device or medium capable of storing data and/or computer-readable instructions. In other examples, some functionality described above as performed by processor 402 may instead be performed by special-purpose circuitry included in sensing device 300.

Additionally, in some examples, sensing device 300 may include one or more detection components (e.g., a current transducer, a voltage transducer, an accelerometer, a gyroscope, a thermometer, an anemometer, and/or others) that may also be useful in detecting a physical, operational, or environmental status of powerline conductor 110, but such detection components are not discussed in depth herein. Moreover, processor 402 may receive information (e.g., digital or analog data) from such detection components to generate further information for analysis subsystem 106A to detect other physical, operational, and/or environmental characteristics associated with powerline conductor 110.

Power management controller 420, in some embodiments, may employ either or both solar cell 422 and/or battery 424 to provide power (e.g., without a wired connection to an external electrical power source) for sensing device 300, including, but not limited to, processor 402, memory 404, and RF transceiver 406. For example, power management controller 420 may direct energy generated by solar cell 422 to battery 424 for storage and/or to other components of sensing device 300. Power management controller 420 may also supply power for sensing device 300 from energy stored in battery 424 when less than sufficient energy is available via solar cell 342. In other examples, sensing device 300 may employ an inductive current transformer, electrostatic series capacitor, or one or more other components to leach power from the current flow in powerline conductor 110 for operating sensing device 300. Moreover, in some embodiments, power management controller 420 may selectively operate various components of sensing device 300, such as by placing one or more such components in a low-power or no-power state for periods of time to reduce overall energy consumption. Some examples of power management controller 420 may include a battery charger circuit, a maximum power point tracker (MPPT), and/or a low-dropout regulator (LDO).

In examples in which a fiber optic cable 112 is associated with (e.g., in close proximity to) powerline conductor 110, as indicated in FIG. 2, each sensing device 300 may be included in a cable clamp 206 that clamps fiber optic cable 112 to powerline conductor 110, thus restricting relative movement between fiber optic cable 112 and powerline conductor 110 in the area of cable clamp 206, thereby reducing friction or other forces between the two that may lead to damage to either fiber optic cable 112 or powerline conductor 110. In some embodiments, cable clamp 206 may encompass sensing device 300 in a substantially weather-tight container, and may retain the components of sensing device 300 in a configuration such that one or more of the components (e.g., surface wave mode transducers 410) are in sufficient proximity to powerline conductor 110 to perform their corresponding functions. Also, in some examples, cable clamp 206 may configured with an eye bolt or other mechanism such that cable claim 206 may be installed on powerline conductor 110 and fiber optic cable 112 by way of a "hot stick" or other device to ensure safety from possible electric shock.

Figure 5:
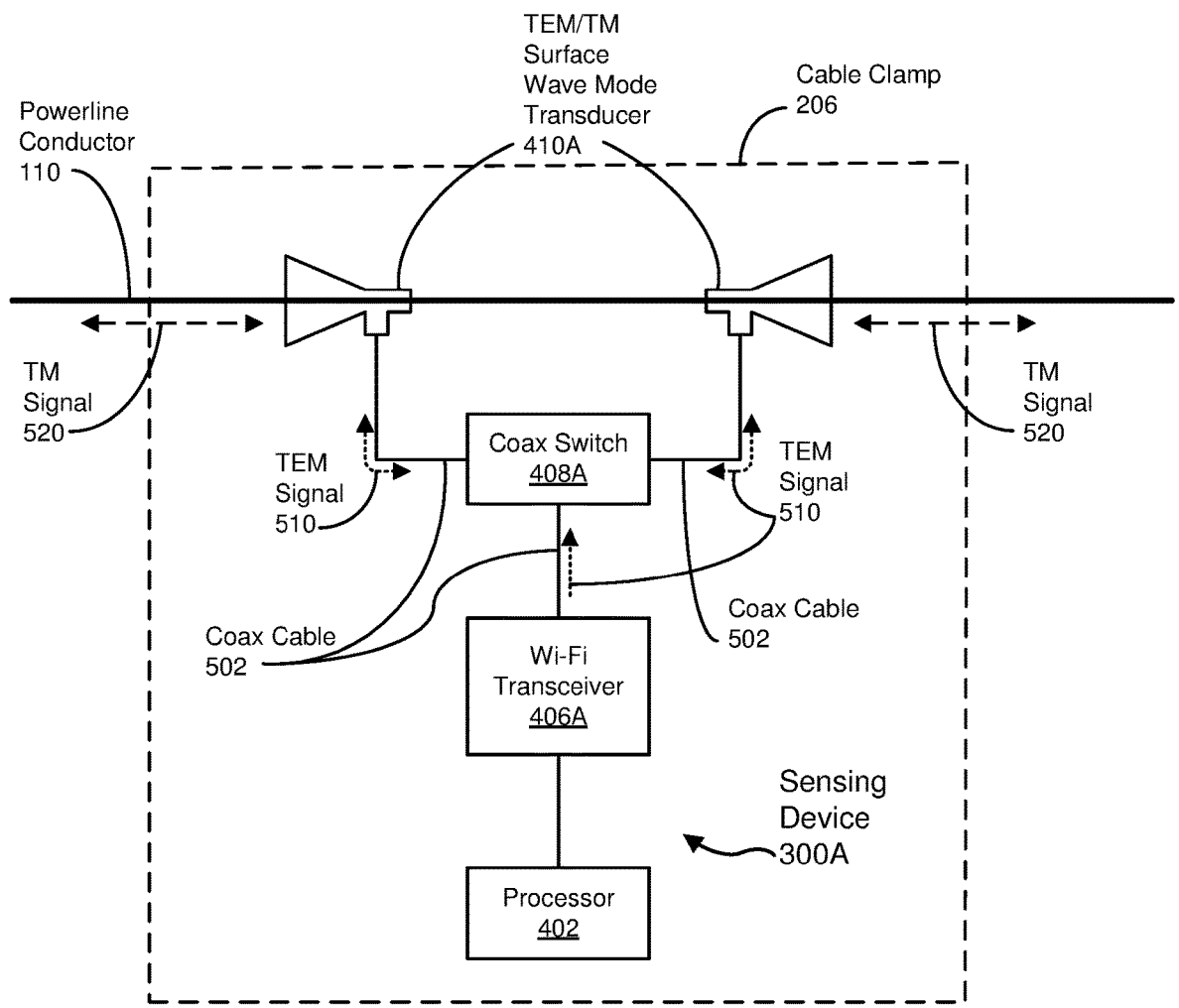
FIG. 5 is a block diagram of another exemplary sensing device employable in the system of FIG. 3.

FIG. 5 is a block diagram of another exemplary sensing device 300A employable in system 100A of FIG. 3. As illustrated in FIG. 5, sensing device 300A may include one or more transverse electromagnetic/transverse magnetic (TEM/TM) surface wave mode transducers 410A (e.g., each serving as surface wave mode transducer 410), coaxial switch 408A (e.g., serving as RF switch 408), and Wi-Fi transceiver 406A (e.g., serving as RF transceiver 406). Other components of sensing device 300 of FIG. 4 (e.g., memory 404, power management controller 420, and so on) may also be included in sensing device 300A and may perform operations such as those discussed above.

Wi-Fi transceiver 406A, in some examples, may receive commands, baseband data, or other data (e.g., from processor 402), and may generate RF signals (e.g., TEM signal 510) based on the received information. In some embodiments, coaxial cable 502 or another RF transmission medium (e.g., a waveguide) may carry TEM signal 510 to coaxial switch 408A. In some embodiments, coaxial switch 408A may receive a control signal (e.g., from processor 402 or Wi-Fi transceiver 406A) that controls which surface wave mode transducer 410A the TEM signal 510 is to be forwarded. Based on the control signal, coaxial switch 408A may direct TEM signal 510 to either or both surface wave mode transducers 410A.

In the examples of FIG. 5, surface wave mode transducers 410A convert TEM signal 510 into a TM signal 520 for propagation as a surface wave mode signal. In some embodiments, each surface wave mode transducer 410A may generally exhibit a conically shaped waveguide defining an axis aligned generally along an axis defined by powerline conductor 110. Moreover, in some examples, surface wave mode transducer 410 may redirect received TEM signal 510 along powerline conductor 110 and convert TEM signal 510 into TM signal 520 as a result of the expanding cross-section of the conically shaped waveguide of surface wave mode transducer 410A. Also, in some examples, while surface wave mode transducers 410A may employ a conically shaped waveguide to generate the surface wave mode signal, other types of surface wave mode transducers 410A may be employed to a similar end in other embodiments. In some examples, TM mode signal 520 may be an electromagnetic wave mode that is optimally suited for surface wave propagation along an exterior of powerline conductor 110.

In some embodiments, TM signal 520, possibly in addition to TEM signal 510, may have a frequency in the 5-to-6 GHz range to promote propagation along powerline conductor 110 as a surface wave mode signal. As such a frequency range complies with the 5 GHz frequency band often employed in Wi-Fi local area network (LAN) communication (e.g., as provided in the IEEE 802.11n standard), TM signal 520 may serve not only as a test signal for detecting physical encroachment of powerline conductor 110, but may also be a Wi-Fi communication signal for facilitating data communication between different sensing devices 300A. Thus, in some embodiments, Wi-Fi transceiver 406A may use a carrier frequency in the 5.8 GHz Wi-Fi band for providing test and/or communication signals. In some such embodiments, Wi-Fi transceiver 406A may employ a conducted launch power of approximately +17 dBm (decibel milliwatts) with a sensitivity of approximately −97 dBm, which may support a Wi-Fi communication link distance along powerline conductor of about 1000 to 1500 feet between sensing devices 300A. In other embodiments, other communication transceivers (e.g., modulator-demodulators) operating in similar or different frequency ranges (e.g., in licensed or unlicensed bands) may be employed to similar end. For example, Bluetooth®, Zigbee®, and other communication protocols operating in the 2.4 GHz range may be employed as TM signal 520 and TEM signal 510. In some embodiments, unlicensed ISM (industrial, scientific, and medical) radio frequency bands, which are typically reserved for non-telecommunication purposes, may be employed for TM signal 520 and TEM signal 510, which may facilitate use of higher power levels for TM signal 520 and TEM signal 510 for more accurate physical encroachment detection. In yet other examples, multiple sensing devices 300A may communicate therebetween by way of other wireless communication means (e.g., an antenna, a wireless microcontroller, and so on) communicatively coupled with processor 402.

Further, in some embodiments, surface wave mode transducers 410A may receive TM signal 520 propagating along powerline conductor 110, convert TM signal 520 into TEM signal 510, and direct TEM signal 510 to coaxial switch 408A (e.g., via coaxial cable 502). Further, based on a control signal (e.g., provided by Wi-Fi transceiver 406A or processor 402), coaxial switch 408A may direct TEM signal 510 to Wi-Fi transceiver 406A, which may convert TEM signal 510 into a baseband signal and/or other information indicative of a signal strength of TEM signal 510 (and, thus, TM signal 520) for processor 402. Processor 402, in some examples, may forward this information to separate analysis subsystem 106 to determine whether physical encroachment of powerline conductor 110 exists, or may at least partially operate as analysis subsystem 106 to make such a determination.

In some examples in which TM signal 520 is also being employed as a communication signal, as mentioned above, sensing device 300A may generate a received signal strength indicator (RSSI), which may be a measurement of power present in a received communication signal in Wi-Fi systems (e.g., as may be generated at Wi-Fi transceiver 406A). Analysis subsystem 106A may use the RSSI as a basis for monitoring any changes in signal strength of TM signal 520 over time to determine whether physical encroachment of powerline conductor 110 has occurred between a sensing device 300A transmitting TM signal 520 and another sensing device 300A receiving TM signal 520. More specifically, in some examples, one Wi-Fi transceiver 406A of a first sensing device 300A may generate Wi-Fi test packets that are transmitted along powerline conductor 110 and received at another Wi-Fi transceiver 406A of a second sensing device 300A. The receiving Wi-Fi transceiver 406A may generate and record the RSSI, as well as magnitude and phase angle information for each Wi-Fi carrier or subcarrier signal carrying the test packets. Analysis subsystem 106A may then monitor and/or otherwise process this information to monitor changes in signal strength (e.g., channel loss) between sensing devices 300A of the transmitting and receiving Wi-Fi transceivers 406A.

In some embodiments, analysis subsystem 106A may interpret different rates of change in the RSSI, magnitude, and/or phase angle information as different types of physical encroachments on powerline conductor 110. For example, analysis subsystem 106A may interpret quick, short-term changes in RSSI and the like as birds or other small animals contacting powerline conductor 110, thus representing little or no impact to the overall operational status of powerline conductor 110. In other examples, analysis subsystem 106A may interpret gradual changes in RSSI and other related information as ice buildup, long-term contact with tree branches, or the like, thus potentially representing a more serious threat to the operational status of powerline conductor 110. Moreover, in some embodiments, signal strength losses due to ice buildup may appear to be smoother relative to subcarrier frequency, as opposed to losses due to tree branch contact, which may cause more loss variation versus frequency, thereby possibly allowing analysis subsystem 106A to distinguish between such causes. In some embodiments, the transmitter and receiver Wi-Fi transceivers 406A may employ (e.g., hop among) multiple sets of subcarrier signals to example the overall frequency range of the test packets to further identify and distinguish between different indications of signal loss.

In the examples described above, powerline conductor 110 may be employed as a medium for propagating a surface wave mode signal external to powerline conductor 110 from a first sensing device 300 and/or 300A at one location to a second sensing device 300 and/or 300A at a different location along powerline conductor 110 to determine a status of powerline conductor 110 (e.g., possible physical encroachment upon powerline conductor 110) between the two locations based on a characteristic (e.g., signal strength) of that signal. In other embodiments, however, a separate signal transmission medium, such as fiber optic cable 112, may carry an optical signal such that analysis subsystem 106 may monitor at least one characteristic of a received portion of the optical signal and determine a status of powerline conductor 110 based at least in part on that characteristic.

Figure 6:
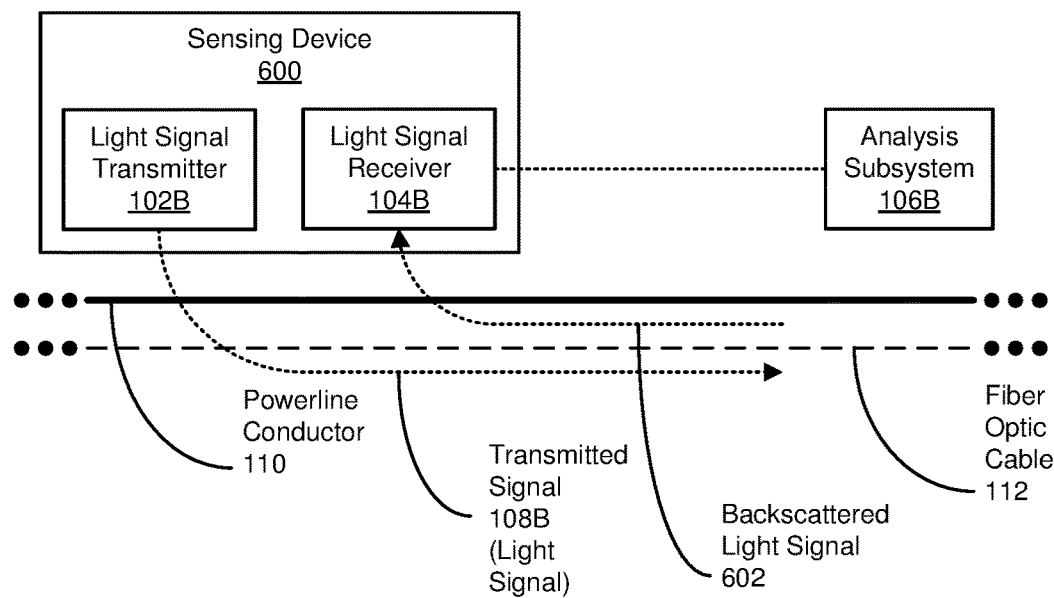
FIG. 6 is a block diagram of an exemplary embodiment of the system of FIG. 1 employing a backscattered light signal in an optical fiber mechanically coupled along the powerline conductor.

FIG. 6 is a block diagram of an exemplary embodiment (system 100B) of system 100 of FIG. 1 that may employ a backscattered light signal 602 in fiber optic cable 112 mechanically coupled along powerline conductor 110. In at least some embodiments of system 100B, a sensing device 600 may include both a light signal transmitter 102B (e.g., serving as signal transmitter 102 of FIG. 1) and a light signal receiver 104B (e.g., operating as signal receiver 104 of FIG. 1). In some examples, light signal transmitter 102B may generate, and provide onto fiber optic cable 112, a transmitted light signal 108B, resulting in backscattered light signal 602 being returned toward sensing device 600, to be received by light signal receiver 104B. Based on at least one characteristic of backscattered light signal 602 received at light signal receiver 104B, sensing device 600 may provide information regarding that characteristic to an analysis subsystem 106B. Further, in at least some embodiments, analysis subsystem 106B may monitor the characteristic to detect a failure of powerline conductor 110 (e.g., a disconnection of powerline conductor 110, an inordinate amount of strain on powerline conductor 110, unwanted vibration of powerline conductor 110, and so on) that may affect fiber optic cable 112 along a portion of powerline conductor 110 extending from sensing device 600 in a direction in which light signal 108B was transmitted. While analysis subsystem 106B is depicted in FIG. 6 as located remotely from sensing device 600 that includes light signal receiver 104B, analysis subsystem 106B may be co-located with light signal receiver 104B in some examples.

Figure 7:
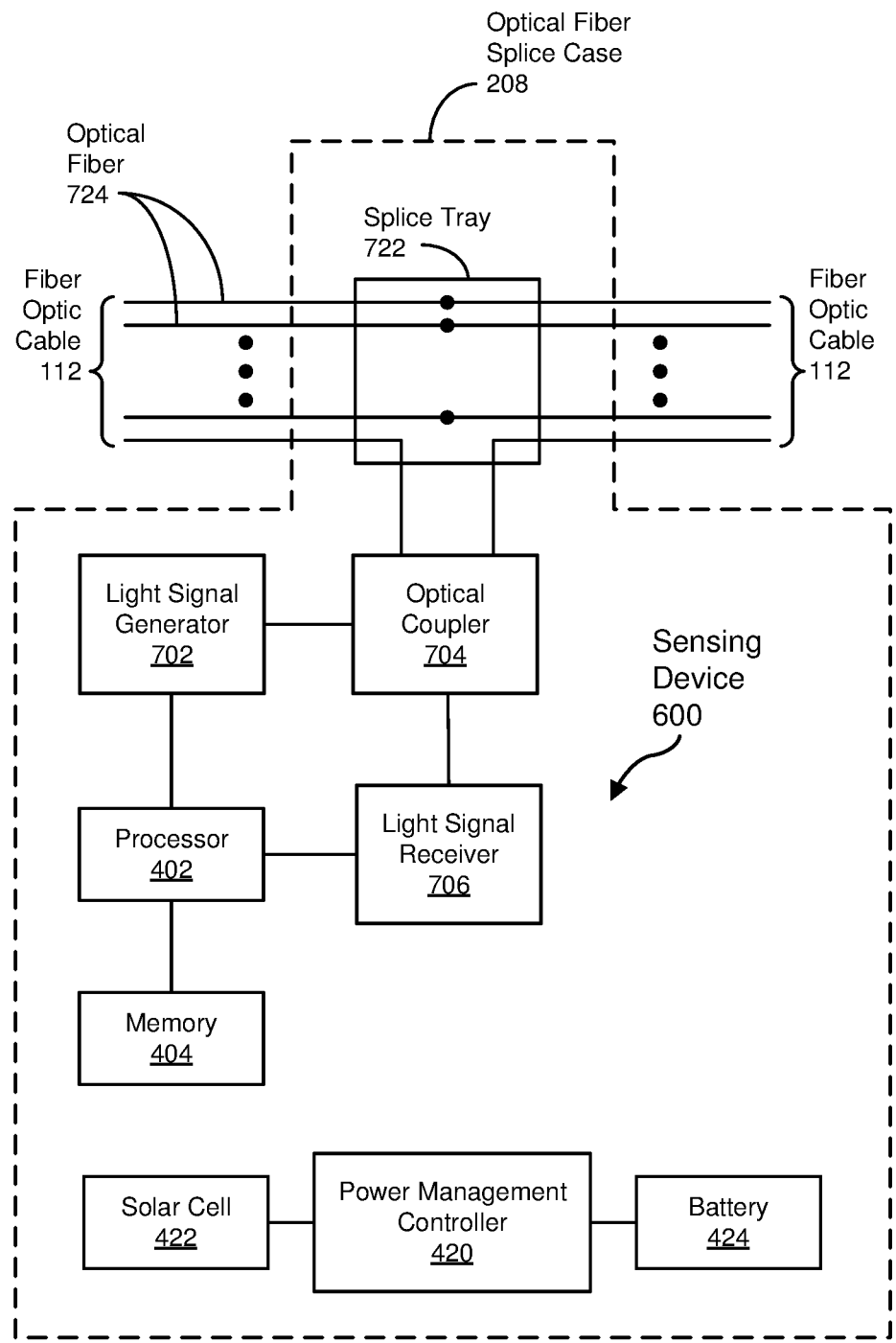
FIG. 7 is a block diagram of an exemplary sensing device employable in the system of FIG. 6.

FIG. 7 is a block diagram of an exemplary sensing device 600 employable in system 100B of FIG. 6. As shown, sensing device 600 may be incorporated in an optical fiber splice case 208, as described above in connection with FIG. 2. More specifically, optical fiber splice case 208 may include a splice tray 722 that holds mechanically-coupled, or fusion-spliced, ends of one or more optical fibers 724 of a section of fiber optic cable 112 to an end of corresponding optical fibers 724 of another section of fiber optic cable 112 to provide a continuous optical data path. In some embodiments, a single optical fiber 724 may be employed to carry light signal 108B and backscattered light signal 602, while the remaining optical fibers 724 (e.g., 24 or 48 optical fibers 724) may carry communication traffic not originating from, or otherwise associated with, sensing devices 600.

In some examples, sensing device 600 may include a light signal generator 702, an optical coupler 704, and a light signal receiver 706. In at least some embodiments, optical coupler 704 may couple light from light signal generator 702 onto an optical fiber 724 of fiber optic cable 112, and may couple light received from optical fiber 724 to light signal receiver 706. Consequently, a combination of light signal generator 702 and optical coupler 704 may serve as light signal transmitter 102B of FIG. 6, while a combination of light signal receiver 706 and optical coupler 704 may represent light signal receiver 104B of FIG. 6. In addition, in some examples, light signal generator 702 and/or light signal receiver 706 may be communicatively coupled with processor 402 such that processor 402 may control the operation of, as well as exchange data with, light signal generator 702 and/or light signal receiver 706.

In some embodiments, light signal generator 702 (e.g., a light pulse generator) may generate a light signal (e.g., a light pulse, a periodic series of light pulses, and/or other light signals) to be transmitted in an optical fiber 724 as light signal 108B, resulting in at least some of the light being returned as backscattered (e.g., reflected) light signal 602, which may be received at light signal receiver 706 via optical coupler 704. In some examples, processor 402, in combination with light signal generator 702, light signal receiver 706, and optical coupler 704, and possibly in conjunction with analysis subsystem 106B, may operate as an optical time-domain reflectometer (OTDR), an interferometer (e.g., possibly in conjunction with one or more mirrors or other optical components), or other optical testing system.

Based on one or more characteristics of backscattered light signal 602 relative to those of transmitted light signal 108B (e.g., time delay, changes in wavelength or frequency, changes in magnitude at one or more frequencies, and so on), analysis subsystem 106B may make some determination regarding the status of powerline conductor 110 (e.g., a failure or other anomaly) due to the mechanical coupling of powerline conductor 110 with fiber optic cable 112, such as by way of cable clamps 206 of FIG. 2.

In some embodiments, analysis subsystem 106B may distinguish between different types of light backscatter represented in backscattered light signal 602 to identify particular types of physical characteristics or anomalies of fiber optic cable 112 (and thus powerline conductor 110). For example, anomalous temperatures (e.g., hot spots) and cable strain (or cable break) along fiber optic cable 112 (and thus powerline conductor 110) may be detected by way of spontaneous Raman backscattering, Brillouin backscattering, and/or Rayleigh backscattering. In some embodiments, spontaneous Raman backscattering may be primarily temperature-dependent (or at least provide clues as to which portions of Raman backscattering are temperature-dependent and which are strain-dependent), while Brillouin backscattering and Rayleigh backscattering may be both temperature-dependent and strain-dependent.

In some examples, Raman backscattering may result in backscattered light signal 602 having both lower and higher frequencies sufficiently different from transmitted light signal 108B such that a dichroic coupler (not shown in FIG. 7) may be implemented in sensing device 600 to separate the lower and higher frequencies from those of transmitted light signal 108B. Moreover, in some examples, an intensity of those portions of backscattered light signal 602 having lower frequencies may increase with increasing temperature, while an intensity of those portions of backscattered light signal 602 having higher frequencies may be substantially temperature-independent. Thus, in some embodiments, analysis subsystem 106B may compare (e.g., via ratio) the intensities of the lower and higher frequencies of backscattered light signal 602 due to Raman scattering to isolate temperature-dependent and strain-dependent effects.

Brillouin backscattering, in some embodiments, may also result in portions of backscattered light signal 602 having both lower and higher frequency components than the frequencies of transmitted light signal 108B, although possibly not as low or high as those resulting from Raman backscattering. In addition, the amount of deviation of the lower and higher frequencies of backscattered light signal due to Brillouin backscattering may be associated with both temperature and strain, such that greater frequency deviations may be caused by higher temperatures and/or greater strain imposed on fiber optic cable 112 (and thus, powerline conductor 110).

Rayleigh backscattering, in some examples, may result in a spreading of frequencies (e.g., both higher and lower) of some portions of backscattered light signal 602 relative to transmitted light signal 108B, while other portions of backscattered light signal 602 may exhibit the same or similar frequencies as transmitted light signal 108B. Such effects may be both temperature-dependent and strain-dependent. In some embodiments, coherent sensing of Rayleigh backscattering may isolate and/or identify the strain-dependent effects on frequency of portions of backscattered light signal 602 from the temperature-dependent effects.

Analysis subsystem 106B, in some embodiments, may employ sensing of one or more of Raman, Brillouin, and/or Rayleigh backscattering, as reflected in backscattered light signal 602, to describe temperature and force-related effects on fiber optic cable 112 and associated powerline conductor 110 at particular locations along fiber optic cable 112. Moreover, in some embodiments, analysis subsystem 106B may distinguish between failure modes related to strain or vibration based on signatures for these failure modes in the detected characteristics (e.g., time delay, frequency shift, intensity change, and so on) of backscattered light signal 602. For example, a tree falling onto powerline conductor 110, or a damaged utility pole 202 carrying powerline conductor 110, may be reflected as a constant or progressively increased strain on a section of fiber optic cable 112 that tends to taper on either side of the strain. In other examples, time-varying changes in strain isolated to one or more sections of fiber optic cable 112 between utility poles 202 may indicate Aeolian vibration (e.g., a low-amplitude (approximately equal to a diameter of powerline conductor 110), high-frequency (approximately 5 to 150 Hz) vibration) or conductor gallop (e.g., a high-amplitude (approximately 1 m or more), low-frequency (approximately 1 Hz) oscillation) experienced by powerline conductor 110, possibly in response to wind.

Processor 402, in some examples, as indicated above, may control light signal generator 702 and light signal receiver 706 to transmit light signal 108B, to receive backscattered light signal 602, and to generate information indicative of at least one characteristic of backscattered light signal 602. Also, in some examples, processor 402 may perform at least some functions associated with analysis subsystem 106B, such as monitoring the at least one characteristic and/or determining a status of powerline conductor 110 based at least in part on the characteristic. Processor 402, in some examples, such as those associated with sensing devices 300 and 300A, may be a microprocessor, microcontroller, DSP, ASIC, or other hardware processor. In one example, processor 402 may be a mixed-signal processor (e.g., an MSP430 mixed-signal processor provided by Texas Instruments, Inc.).

Memory 404, in some examples, similar to those corresponding to sensing devices 300 and 300A, may provide storage for data, signals, or status received and/or generated by processor 402. In some embodiments, memory 404 may also include instructions to be executed by processor 402 to perform its various functions or tasks, as described in greater detail above. In one embodiment, memory 404 may be a separate memory component, or may be incorporated within processor 402. Memory 404 generally represents any type or form of volatile or non-volatile storage device or medium capable of storing data and/or computer-readable instructions. In other examples, some functionality described above as performed by processor 402 may instead be performed by special-purpose circuitry included in sensing device 600.

In at least some embodiments, power management controller 420, solar cell 422, and/or battery 424 may provide power (e.g., without a wired connection to an external electrical power source) for the various components of sensing device 600, in a manner similar to that described above with respect to sensing device 300.

In some examples, sensing device 600 may also operate as a data injection device that receives data from other sensing devices 300 and/or 300A (e.g., located at cable clamps 206) that may be relayed to analysis subsystem 106. To that end, in some embodiments, sensing device 600 may further include communication circuitry and/or components that may facilitate wireless communication with sensing devices 300 and/or 300A (e.g., by way of an antenna, wireless microcontroller, and so on) to receive data regarding sensed characteristics of powerline conductor 110, as discussed above.

Additionally, in some examples, sensing device 600, when operating as a data injection device, may include circuitry and/or components for injecting data onto an optical fiber 724 (e.g., the same optical fiber 724 employed to send and receive test signals, such as transmitted light signal 108B and backscattered light signal 602) for transmission, such as to analysis subsystem 106B. Such data may include the data received from other sensing devices 300 and/or 300A as well as data generated at sensing device 600. To inject that data into optical fiber 724, sensing device 600 may include, for example, an electrical-to-optical signal converter circuit that transforms the data (e.g., digital data) into an optical signal in preparation for introduction onto optical fiber 724. In some embodiments, the electrical-to-optical signal converter may include a physical (PHY) layer transceiver and an optical transceiver. An example of the PHY layer transceiver may be a type of electronic interface protocol transceiver that converts the data into an electronic interface protocol signal, such as an Ethernet physical layer transceiver. The optical transceiver, in some examples, may be communicatively coupled to the PHY layer transceiver and may transform the electronic interface protocol signal generated by the PHY layer transceiver into an optical signal. More specifically, in one example, the optical transceiver may be a single-fiber, single-wavelength (SFSW) coarse wavelength-division multiplexing (CWDM) small form-factor pluggable (SFP) 100-megabit (Mbit) Ethernet optical transceiver.

To inject the resulting optical signal from the optical transceiver onto one of the optical fibers 724 of fiber optic cable 112, sensing device 600 may include an optical add/drop multiplexer (OADM) coupled to an end of the one of the optical fibers 724 of each section of fiber optic cable 112 being spliced together at optical fiber splice case 208. In some examples, the OADM may inject data from the optical transceiver onto a spare or otherwise unused wavelength or wavelength band of an incoming optical fiber 724 while passing the remaining wavelengths that may be carrying other data (e.g., data from another sensing device 600) through to corresponding optical fiber 724 of the outgoing section of fiber optic cable 112 (e.g., for transmission to analysis subsystem 106).

In some examples, some optical fiber splice cases 208 may include a sensing device 600 that may or may not also operate as a data injection device, or may include a data injection device that does not operation as sensing device 600, depending on the particular coverage of optical sensing and optical data transmission capabilities desired at each location. In addition, some optical fiber splice cases 208 may also include optical data transmission devices for facilitating bidirectional command, status, and data transmission for other SCADA purposes. As a result, different lengths or spans along fiber optic cable 112 may exist between sensing device 600, data injection devices, and so on. Consequently, in some embodiments, optical signals that are carried over the single optical fiber 724 and that are used for sensing, grid monitoring, and the like may be separated into three different optical wavelength bands. For example, sensing devices 300 and/or 300A that use surface wave mode signals (e.g., for detection of physical encroachment) and other electrical sensing techniques at some cable clamps 206 may be located at relatively frequent intervals (e.g., every 2 km) along powerline conductor 110, which may result in data injection devices being located periodically among several such sensing devices 300 and/or 300A to receive and inject such data onto the single optical fiber 724. Optical network nodes for more general SCADA purposes (e.g., for both supervisor control and data acquisition of electrical grid operations) may be located further between (e.g., tens of kilometers). On the other hand, sensing devices 600 employing backscattering techniques, as described above, may be located even further apart (e.g., 40 km to 100 km) to minimize the number of sensing devices 600. Consequently, given the relative proximity of data injection devices, data received from sensing device 300 and/or 300A may be injected onto a relatively short wavelength band (e.g., below 1400 nm) since such data can afford a relatively high signal loss due to the comparatively short intervals between data injection devices. Oppositely, given the possibly long runs between sensing devices 600, transmitted light signals 108B used for sensing via backscattered light signals 602 may reside in a longer wavelength band (e.g., 1550 nm to 1625 nm). Further, given the intermediate distances possible between SCADA nodes, data related to those nodes may be transmitted (e.g., bidirectionally between nodes) at wavelengths intermediate to those employed for optical sensing in sensing device 600 and those used by data injection devices to inject data received from sensing devices 300 and/or 300A. In some examples, use of these different wavelength bands may allow a data injection device using an OADM (or similar optical component for injecting data signals onto the single optical fiber 724) to pass transmitted light signals 108B and resulting backscattered light signals 602 unimpeded through the OADM.

Figure 8:
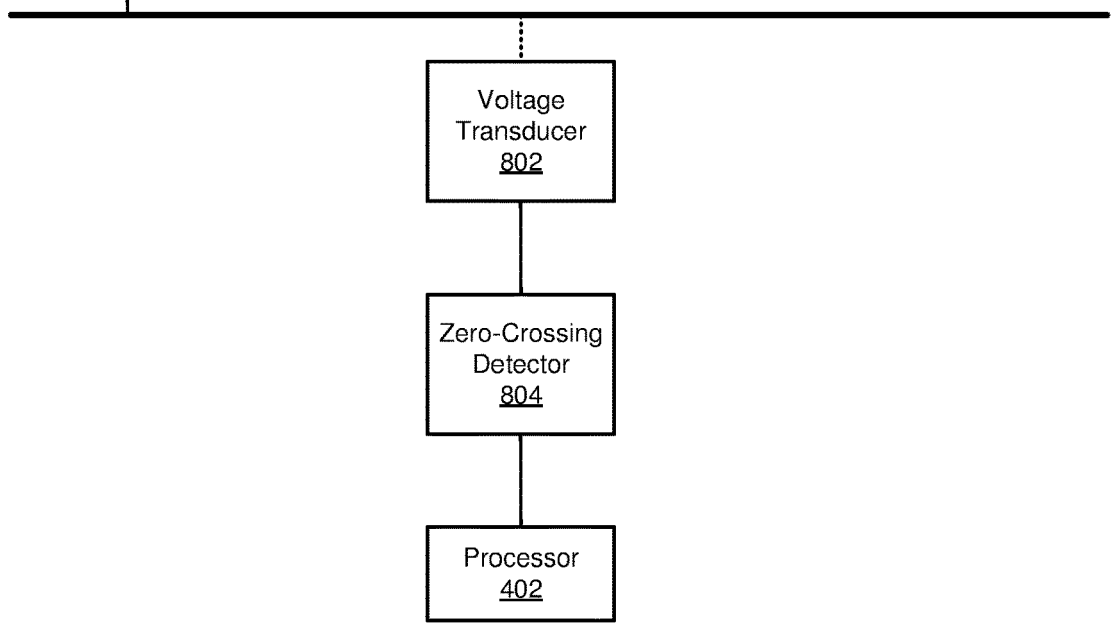
FIG. 8 is a block diagram of an exemplary timing control subsystem employable in any of the sensing devices of FIG. 4, 5, or 7.

FIG. 8 is a block diagram of an exemplary communication timing subsystem 800 employable in any of sensing devices 300, 300A, and 600 of FIGS. 4, 5, and 7, respectively. As shown in FIG. 8, communication timing subsystem 800 may include a voltage transducer 802 and a zero-crossing detector 804 in addition to processor 402 (introduced above). In some examples, voltage transducer 802, which may be included as a voltage sensor in sensing device 300 and/or 300A, may detect an alternating-current (AC) voltage signal of electrical power carried on powerline conductor 110 over time, such as in a continuous or sampled manner, and generate an analog voltage, digital data, or the like indicating the current AC voltage signal. In turn, zero-crossing detector 804 may determine points in time at which the current AC voltage signal crosses a zero or midpoint threshold. In some examples, zero-crossing detector 804 may also indicate whether the detected zero crossing is a low-to-high or high-to-low zero-crossing of the AC voltage. In some embodiments, processor 402 may control the timing of wireless communication between one sensing device 300 and/or 300A and another, or between one or more sensing devices 600 and a data injection device, to reduce the overall percentage of time during which wireless communication occurs. Such reduction may be possible since wireless communication between devices 300 and/or 300A residing on the same powerline conductor 110 may be synchronized to each other based on the zero-crossing information, which is based on the same AC voltage carried on powerline conductor 110. For example, multiple sensing devices 300 and/or 300A, possibly in addition to data injection devices, may attempt to communicate wirelessly in response to each zero-crossing of the AC voltage, each positive or negative zero-crossing, every nth zero-crossing, or the like. In some examples, the zero-crossing timing information may also be employed by power management controller 420 to control power consumption of the various components of sensing devices 300 and/or 300A, as well as the data injection devices, to reduce overall power consumption during time periods when these devices are not communicating wirelessly. In some examples associated with the use of communication timing subsystem 800 at a data injection device (e.g., located at optical fiber splice case 208), phase-to-ground transition 210 may include voltage transducer 802 and zero-crossing detector 804, which may transmit zero-crossing information for timing purposes via a dielectric light guide to processor 402 of the data injection device.

Figure 9:
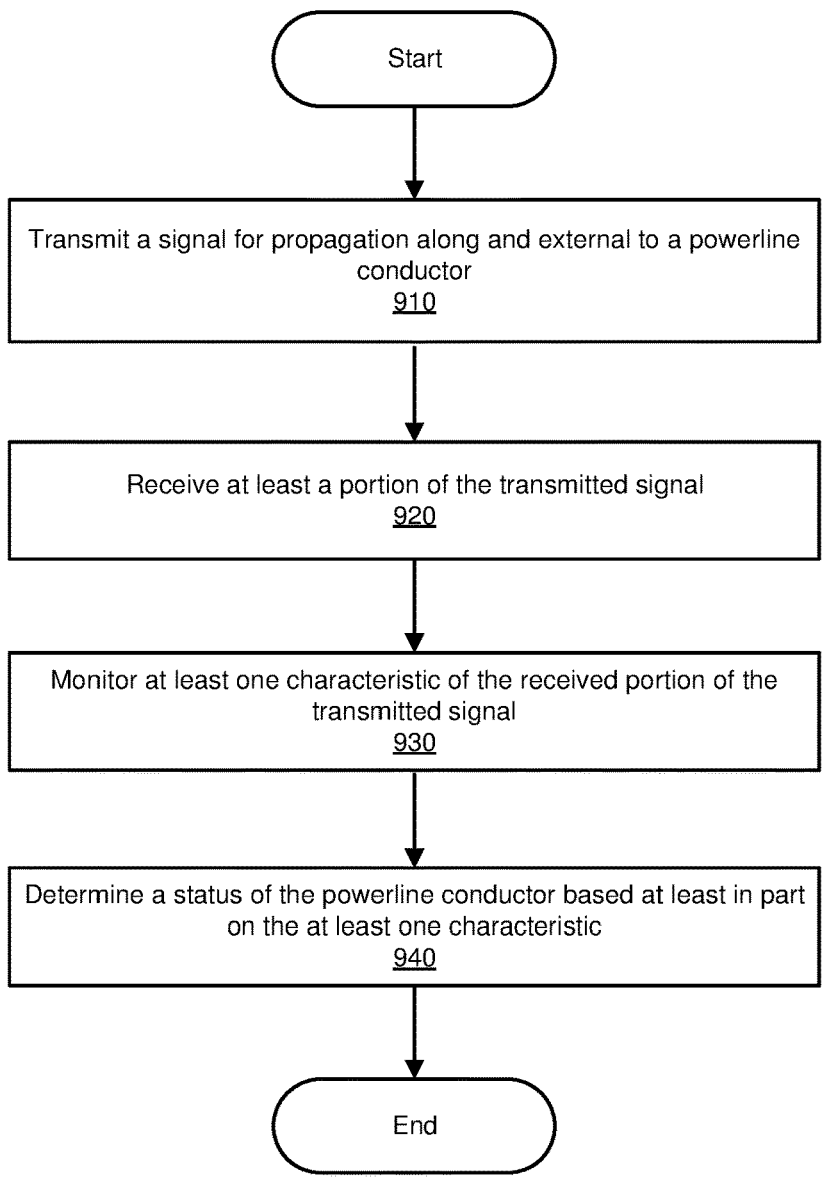
FIG. 9 is a flow diagram of an exemplary method for distributed sensing of a powerline conductor.

FIG. 9 is a flow diagram of an exemplary method 900 for distributed sensing of a powerline conductor (e.g., powerline conductor 110). In some examples, method 900 may be performed by a combination of one or more signal transmitters (e.g., signal transmitter 102), signal receivers (e.g., signal receiver 104), and an analysis subsystem (e.g., analysis subsystem 106). In the method 900, at step 910, a signal transmitter may transmit a signal for propagation along and external to a powerline conductor. At step 920, in some examples, a signal receiver may receive at least a portion of the transmitted signal. At step 930, an analysis subsystem may monitor at least one characteristic of the received portion of the transmitted signal. The analysis subsystem, at step 940, may determine a status of the powerline conductor based at least in part on the at least one characteristic. In some embodiments, the transmitted signal from the signal transmitter may be a surface wave mode signal propagated from a first location along an exterior of the powerline conductor, where the signal receiver receives at least a portion of the transmitted signal at a second location along the powerline conductor. In other examples, the transmitted signal may be a light signal coupled onto an optical fiber of a fiber optic cable (e.g., fiber optic cable 112) mechanically coupled to, and aligned with, the powerline conductor, where the received portion of the transmitted light signal may be backscattered light received at substantially the same location that the transmitted light signal is coupled onto the optical fiber.

Figure 10:
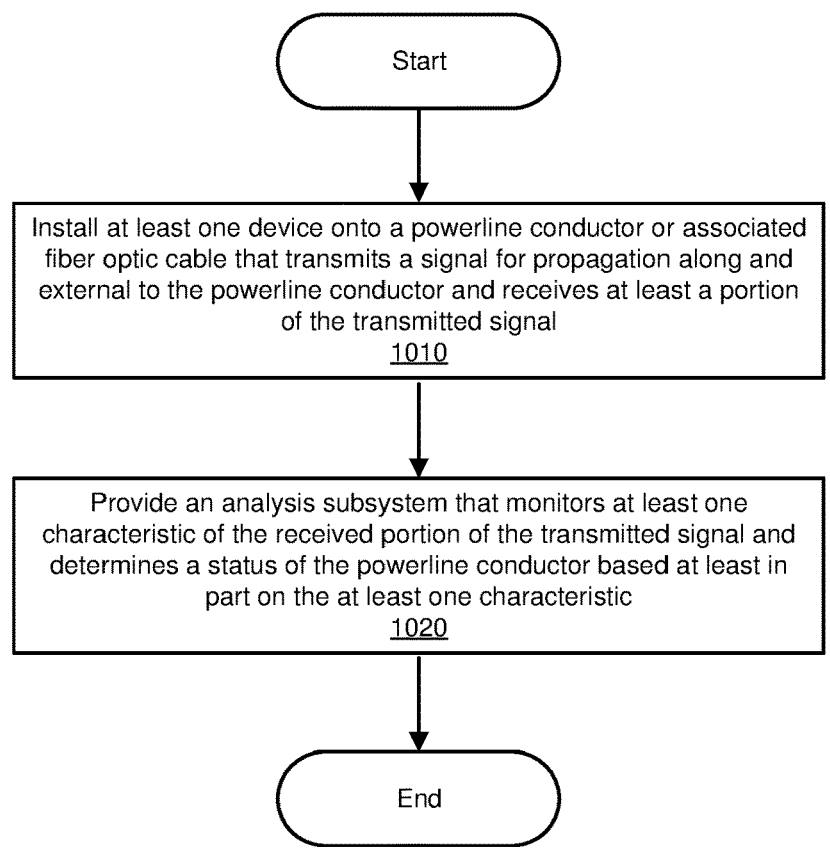
FIG. 10 is a flow diagram of an exemplary method of installing a system for distributed sensing of a powerline conductor.

FIG. 10 is a flow diagram of an exemplary method 1000 of installing a system (e.g., system 100 of FIG. 1) for distributed sensing of a powerline conductor (e.g., powerline conductor 110). In some embodiments, at step 1010, at least one device (e.g., a sensing device 300, 300A, and/or 600) that transmits a signal for propagation along and external to the powerline conductor, and that receives at least a portion of the transmitted signal, may be installed onto a powerline conductor or an associated a fiber optic cable (e.g., fiber optic cable 112). At step 1020, an analysis subsystem (e.g., analysis subsystem 106) may be provided that monitors at least one characteristic of the received portion of the transmitted signal and determines a status of the powerline conductor based at least in part on the at least one characteristic. In some embodiments, a single device (e.g., sensing device 600) or separate devices (e.g., sensing devices 300 and/or 300A) may perform the transmitting and receiving functions, as discussed above. Moreover, one or more of the tasks ascribed to the analysis subsystem may be performed in the same device that performs the transmitting and/or receiving of the sensing signals.

The steps shown in FIGS. 9 and 10, as well as other tasks performed by signal transmitter 102 and signal receiver 104 (as employed in sensing devices 300, 300A, and/or 600), and by analysis subsystem 106, may be performed by any suitable computer-executable code and/or computing system, including processor 402 in conjunction with memory 404, as described above. In one example, each of the steps shown in FIGS. 9 and 10 may represent an algorithm whose structure includes and/or is represented by multiple substeps, examples of which are described above in greater detail.

As explained above in conjunction with FIGS. 1 through 10, the systems and methods described herein may facilitate remote sensing of one or more characteristics of a powerline conductor by transmitting a sensing signal, such as an RF surface wave mode signal along an exterior of the powerline conductor, or by a light signal transmitted in an optical fiber of a fiber optic cable mechanically coupled with the powerline conductor. The sensing signal, as described above, may yield useful, relatively fine-grained information regarding the current status (e.g., physical encroachment, undue strain or movement, inordinately high temperatures, etc.) that may not be gleaned from other more traditional types of monitored information, such as electrical voltage and current carried by the powerline conductor. In some examples, the various devices may be included in infrastructure (e.g., cable clamps, optical fiber splice cases, etc.) employed when installing a fiber optic cable in an aerial OSP environment, in which an electrical transmission or distribution system is leveraged to add fiber optic communication capacity to a geographic area. Consequently, in some examples, the additional costs of providing the fiber optic cable may be offset by the financial benefits possibly provided by the addition of the resulting sensing devices, such as by detecting present and/or impending failure conditions.

EXAMPLE EMBODIMENTS

Example 1: A system may include (1) a signal transmitter that includes (a) a radio frequency generator that generates a first radio frequency electromagnetic signal and (b) a first transducer that converts the first radio frequency electromagnetic signal to a first surface wave mode signal imposed onto a powerline conductor at a first location in a first direction toward a second location along the powerline conductor, (2) a signal receiver that includes a second transducer located at the second location along the powerline conductor that converts the first surface wave mode signal into a second radio frequency electromagnetic signal, and (3) an analysis subsystem that monitors a signal strength of the second radio frequency electromagnetic signal over time to determine whether a physical encroachment of the powerline conductor exists between the first location and the second location.

Example 2: The system of Example 1, where (1) at least one of the first radio frequency electromagnetic signal or the second radio frequency electromagnetic signal may include a transverse electromagnetic mode signal and (2) the first surface wave mode signal may include a transverse magnetic mode signal.

Example 3: The system of either Example 1 or Example 2, where the system may further include (1) a first device at the first location and including the radio frequency generator and the first transducer and (2) a second device at the second location and including the second transducer.

Example 4: The system of Example 3, where (1) the first device may include a first clamping device that mechanically couples a fiber optic cable to the powerline conductor at the first location and (2) the second device may include a second clamping device that mechanically couples the fiber optic cable to the powerline conductor at the second location.

Example 5: The system of Example 3, where (1) at least one of the first radio frequency electromagnetic signal or the second radio frequency electromagnetic signal may have a carrier frequency for a wireless local area network and (2) the first device may transmit data to the second device using the carrier frequency for the wireless local area network.

Example 6: The system of Example 5, where the wireless local area network may include a Wi-Fi communication network.

Example 7: The system of Example 5, where the analysis subsystem may determine a received signal strength indication associated with the wireless local area network to monitor the signal strength of the second radio frequency electromagnetic signal.

Example 8: The system of Example 5, where the analysis subsystem, to monitor the signal strength of the second radio frequency electromagnetic signal, may determine at least one of (1) a magnitude of at least one carrier signal of the wireless local area network or (2) a phase angle of the at least one carrier signal of the wireless local area network.

Example 9: The system of Example 5, where the first device may further include (1) a detection circuit that detects a characteristic of power carried on the powerline conductor and (2) a communication timing circuit that causes the first surface wave mode signal to be imposed onto the powerline conductor according to a timing that is based on the characteristic of power carried on the powerline conductor.

Example 10: The system of Example 9, where the characteristic of power carried on the powerline conductor detected by the detection circuit may include a zero-crossing of a voltage carried on the powerline conductor.

Example 11: The system of Example 3, where (1) the first device may further include a third transducer that converts the first radio frequency electromagnetic signal to a second surface wave mode signal imposed onto the powerline conductor at the first location in a second direction opposite the first direction along the powerline conductor, (2) the system may further include a third device that is located at a third location in the second direction from the first location and that includes a fourth transducer that converts the second surface wave mode signal into a third radio frequency electromagnetic signal, and (3) the analysis subsystem may monitor a signal strength of the third radio frequency electromagnetic signal over time to determine whether a physical encroachment of the powerline conductor exists between the first location and the third location.

Example 12: The system of Example 11, where the first device may further include a radio frequency switch that directs the first radio frequency electromagnetic signal to at least one of the first transducer or the third transducer.

Example 13: The system of either Example 1 or Example 2, where at least one of the first transducer and the second transducer may include a conically-shaped waveguide defining an axis aligned along the powerline conductor.

Example 14: The system of either Example 1 or Example 2, where the analysis subsystem may determine whether a physical encroachment of the powerline conductor exists between the first location and the second location based on a rate of change of signal strength of the second radio frequency electromagnetic signal.

Example 15: A method may include (1) transmitting a surface wave mode signal imposed on a powerline conductor at a first location along the powerline conductor toward a second location along the powerline conductor, (2) receiving at least a portion of the transmitted surface wave mode signal at the second location along the powerline conductor, and (3) monitoring a signal strength of the received portion of the transmitted surface wave mode signal over time to determine whether a physical encroachment of the powerline conductor exists between the first location and the second location.

Example 16: The method of Example 15, where a determination whether a physical encroachment of the powerline conductor exists between the first location and the second location may be based on a rate of change of the signal strength associated with the received portion of the transmitted surface wave mode signal.

Example 17: The method of either Example 15 or Example 16, where (1) the surface wave mode signal may include a wireless network communication signal, and (2) the signal strength associated with the received portion of the transmitted surface wave mode signal may be indicated as a received signal strength indication associated with the wireless network communication signal.

Example 18: The method of either Example 15 or Example 16, where (1) the surface wave mode signal may include a wireless network communication signal, and (2) the signal strength associated with the received portion of the transmitted surface wave mode signal may be indicated as at least one of a magnitude or a phase angle associated with the wireless network communication signal.

Example 19: A method may include (1) installing a first device onto a powerline conductor at a first location along the powerline conductor, where the first device transmits a surface wave mode signal imposed on the powerline conductor at the first location for propagation along the powerline conductor toward a second location along the powerline conductor, (2) installing a second device onto the powerline conductor at the second location along the powerline conductor, where the second device receives at least a portion of the transmitted surface wave mode signal at the second location, and (3) providing an analysis subsystem, communicatively coupled to at least the second device, that monitors a signal strength of the received portion of the transmitted surface wave mode signal over time to determine whether a physical encroachment of the powerline conductor exists between the first location and the second location.

Example 20: The method of Example 19, where at least one of the first device and the second device may include a clamping device that secures a fiber optic cable to the powerline conductor.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more computer-executable modules designed to accomplish the computer-executable tasks described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic storage media (e.g., hard dish drives, tape drives, and floppy disks), optical storage media (e.g., Compact Disks (CDs), Digital Video Disks (DVDs), and BLU-RAY disks), electronic storage media (e.g., solid-state disks and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
    a signal transmitter comprising:
        a radio frequency generator that generates a first radio frequency electromagnetic signal; and
        a first transducer that converts the first radio frequency electromagnetic signal to a first surface wave mode signal imposed onto a powerline conductor at a first location in a first direction toward a second location along the powerline conductor;
    a signal receiver comprising a second transducer located at the second location along the powerline conductor that converts the first surface wave mode signal into a second radio frequency electromagnetic signal; and
    an analysis subsystem that monitors a signal strength of the second radio frequency electromagnetic signal over time to determine whether a physical encroachment of the powerline conductor exists between the first location and the second location.

2. The system of claim 1, wherein:
    at least one of the first radio frequency electromagnetic signal or the second radio frequency electromagnetic signal comprises a transverse electromagnetic mode signal; and
    the first surface wave mode signal comprises a transverse magnetic mode signal.

3. The system of claim 1, wherein the system further comprises:
    a first device at the first location and comprising the radio frequency generator and the first transducer; and
    a second device at the second location and comprising the second transducer.

4. The system of claim 3, wherein:
    the first device comprises a first clamping device that mechanically couples a fiber optic cable to the powerline conductor at the first location; and
    the second device comprises a second clamping device that mechanically couples the fiber optic cable to the powerline conductor at the second location.

5. The system of claim 3, wherein:
    at least one of the first radio frequency electromagnetic signal or the second radio frequency electromagnetic signal has a carrier frequency for a wireless local area network; and
    the first device transmits data to the second device using the carrier frequency for the wireless local area network.

6. The system of claim 5, wherein the wireless local area network comprises a Wi-Fi communication network.

7. The system of claim 5, wherein the analysis subsystem determines a received signal strength indication associated with the wireless local area network to monitor the signal strength of the second radio frequency electromagnetic signal.

8. The system of claim 5, wherein:
    the analysis subsystem, to monitor the signal strength of the second radio frequency electromagnetic signal, determines at least one of:
        a magnitude of at least one carrier signal of the wireless local area network; or
        a phase angle of the at least one carrier signal of the wireless local area network.

9. The system of claim 5, wherein the first device further comprises:
    a detection circuit that detects a characteristic of power carried on the powerline conductor; and
    a communication timing circuit that causes the first surface wave mode signal to be imposed onto the powerline conductor according to a timing that is based on the characteristic of power carried on the powerline conductor.

10. The system of claim 9, wherein the characteristic of power carried on the powerline conductor detected by the detection circuit comprises a zero-crossing of a voltage carried on the powerline conductor.

11. The system of claim 3, wherein:
    the first device further comprises a third transducer that converts the first radio frequency electromagnetic signal to a second surface wave mode signal imposed onto the powerline conductor at the first location in a second direction opposite the first direction along the powerline conductor;
    the system further comprises a third device that is located at a third location in the second direction from the first location and that comprises a fourth transducer that converts the second surface wave mode signal into a third radio frequency electromagnetic signal; and the analysis subsystem monitors a signal strength of the third radio frequency electromagnetic signal over time to determine whether a physical encroachment of the powerline conductor exists between the first location and the third location.

12. The system of claim 11, wherein the first device further comprises a radio frequency switch that directs the first radio frequency electromagnetic signal to at least one of:
the first transducer; or
the third transducer.

13. The system of claim 1, wherein at least one of the first transducer and the second transducer comprises a conically-shaped waveguide defining an axis aligned along the powerline conductor.

14. The system of claim 1, wherein the analysis subsystem determines whether a physical encroachment of the powerline conductor exists between the first location and the second location based on a rate of change of signal strength of the second radio frequency electromagnetic signal.

15. A method comprising:
transmitting a surface wave mode signal imposed on a powerline conductor at a first location along the powerline conductor toward a second location along the powerline conductor;
receiving at least a portion of the transmitted surface wave mode signal at the second location along the powerline conductor; and
monitoring a signal strength of the received portion of the transmitted surface wave mode signal over time to determine whether a physical encroachment of the powerline conductor exists between the first location and the second location.

16. The method of claim 15, wherein a determination whether a physical encroachment of the powerline conductor exists between the first location and the second location is based on a rate of change of the signal strength associated with the received portion of the transmitted surface wave mode signal.

17. The method of claim 15, wherein:
the surface wave mode signal comprises a wireless network communication signal; and
the signal strength associated with the received portion of the transmitted surface wave mode signal is indicated as a received signal strength indication associated with the wireless network communication signal.

18. The method of claim 15, wherein:
the surface wave mode signal comprises a wireless network communication signal; and
the signal strength associated with the received portion of the transmitted surface wave mode signal is indicated as at least one of a magnitude or a phase angle associated with the wireless network communication signal.

19. A method comprising:
installing a first device onto a powerline conductor at a first location along the powerline conductor, wherein the first device transmits a surface wave mode signal imposed on the powerline conductor at the first location for propagation along the powerline conductor toward a second location along the powerline conductor;
installing a second device onto the powerline conductor at the second location along the powerline conductor, wherein the second device receives at least a portion of the transmitted surface wave mode signal at the second location; and
providing an analysis subsystem, communicatively coupled to at least the second device, that monitors a signal strength of the received portion of the transmitted surface wave mode signal over time to determine whether a physical encroachment of the powerline conductor exists between the first location and the second location.

20. The method of claim 19, wherein at least one of the first device and the second device comprises a clamping device that secures a fiber optic cable to the powerline conductor.

* * * * *